United States Patent [19]
Yoda

[11] 4,382,204
[45] May 3, 1983

[54] TUNING FORK-SHAPED QUARTZ OSCILLATOR

[75] Inventor: Hiroshi Yoda, Tokyo, Japan

[73] Assignee: Nihon Dempa Kogyo Co., Ltd., Tokyo, Japan

[21] Appl. No.: 208,065

[22] Filed: Nov. 18, 1980

[30] Foreign Application Priority Data

Nov. 22, 1979 [JP] Japan ............................ 54-162163[U]

[51] Int. Cl.³ ............................................ H01L 41/08
[52] U.S. Cl. .................................... 310/366; 310/330; 310/333; 310/370
[58] Field of Search ......... 310/330, 333, 361, 365–368, 310/370; 368/167, 255; 84/409, 457; 331/156, 163

[56] References Cited
U.S. PATENT DOCUMENTS 4,173,726  11/1979  Hanji ................................. 310/370 X

FOREIGN PATENT DOCUMENTS 885562  8/1953  Fed. Rep. of Germany ...... 331/163
2006520  5/1979  United Kingdom ................ 310/370

Primary Examiner—William M. Shoop
Assistant Examiner—Peter S. Wong
Attorney, Agent, or Firm—Frishauf, Holtz, Goodman and Woodward

[57] ABSTRACT

A tuning fork-shaped quartz oscillator comprises a U-shaped quartz oscillator body which comprises of a pair of vibration arms having a rectangular cross section and a base connecting the vibration arms at one end. Four excitation electrodes are provided respectively on the four sides of each vibration arm, each electrode having a portion laid on two adjacent sides. The oscillator further comprises connecting means including a first input terminal and a second input terminal which supply drive voltage to the excitation electrodes so that the vibration arms keep vibrating in opposite phase relation in both a bending mode and a twisting mode.

13 Claims, 9 Drawing Figures

TUNING FORK-SHAPED QUARTZ OSCILLATOR

BACKGROUND OF THE INVENTION

This invention relates to a tuning fork-shaped quartz oscillator which oscillates in both a bending mode and a twisting mode at the same time.

There is known a wristwatch provided with a tuning fork-shaped quartz oscillator which generates signals having a resonance frequency of 32.768 KHz. The output signals of the quartz oscillator are frequency-divided to provide 1 Hz signals, which drive the movement of the watch. The quartz oscillator oscillates in a bending mode to produce signals of a relatively low resonance frequency, i.e. 32.768 KHz. Since its frequency is low, the output signal of the quartz oscillator can be frequency-divided by a frequency divider having a small number of frequency-dividing stages made of, for example a C-MOS integrated circuit which consumes little power.

The accuracy of a wristwatch provided with a quartz oscillator is determined by the frequency-temperature characteristic of the quartz oscillator. This characteristic is represented by a curve of secondary degree, the peak of which coincides with a temperature of about 20° C. Any wristwatch provided with a quartz oscillator is so designed as to keep good time over a temperature range of $-10°$ C. to $+60°$ C. To enhance the accuracy of the watches it is required that the resonance frequency of the quartz oscillator used should remain unchanged over said temperature range. If provided with a tuning fork-shaped quartz oscillator of known type whose resonance frequency varies along with temperature, a wristwatch will gain or lose about 15 seconds every month and will not be said to be highly accurate.

AT-cut quartz oscillators which oscillate in a sliding mode are used also in wristwatches. They have a frequency-temperature characteristic which is represented by a curve of third degree having a horizontal portion. This means that the resonance frequency of an AT-cut quartz oscillator remains unchanged over a specific temperature range unlike the tuning fork-shaped quartz oscillator which oscillates in a bending mode. If provided with an AT-cut quartz oscillator whose resonance frequency is, for example, 4.19 MHz, a wristwatch will gain or lose only about five seconds per year.

The high resonance frequency, e.g. 4.19 MHz, of the output signals of an AT-cut quartz oscillator cannot be effectively divided by a C-MOS integrated circuit. This is because the C-MOS integrated circuit operates at a low speed. If a C-MOS integrated circuit is to be used, the AT-cut quartz oscillator has to be made thicker thereby to reduce its output resonance frequency. But it is impossible to reduce the resonance frequency to that of a tuning fork-shaped quartz oscillator, however thin the AT-cut quartz oscillator is made. Inevitably, to divide the resonance frequency of an AT-cut quartz oscillator, use must be made of a C-MOS integrated circuit having more frequency-dividing stages than a C-MOS integrated circuit which can effectively divide the resonance frequency of a tuning fork-shaped quartz oscillator. In other words, a C-MOS integrated circuit of large power consumption must be employed to divide the resonance frequency of an AT-cut quartz oscillator. Further, if an AT-cut quartz oscillator is made thick to reduce its output resonance frequency, the wristwatch using the oscillator will inevitably be thick.

An object of this invention is to provide a tuning fork-shaped quartz oscillator which is small-sized and highly reliable and which can be used in combination with a C-MOS integrated circuit of little power consumption to provide, for example, a wristwatch.

SUMMARY OF THE INVENTION

According to this invention, the above-mentioned object is achieved by a tuning fork-shaped quartz oscillator which comprises a U-shaped quartz oscillator body comprising of a pair of vibration arms having a substantially rectangular cross section and a base connecting the vibration arms at one end, excitation electrodes each having portions laid on two adjacent sides of the respective vibration arms, and connecting means including a first input terminal and a second input terminal for supplying drive voltage to the excitation electrodes so as to cause the vibration arms to keep vibrating in opposite phase relation in both a bending mode and a twisting mode.

This invention can be more fully understood from the following detailed description when taken in conjunction with the accompanying drawings.

DETAILED DESCRIPTION

Figure 1:
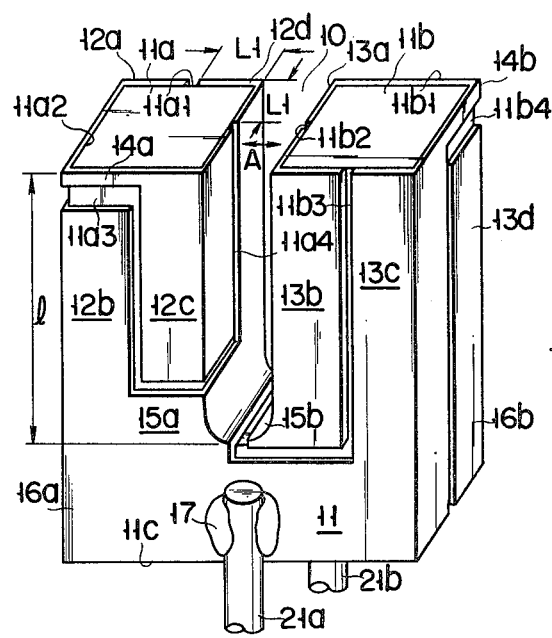
FIG. 1 is a perspective view of a tuning fork-shaped quartz oscillator embodying this invention.

A quartz oscillator body 11 shown in FIG. 1 is substantially U-shaped. It comprises of a pair of vibration arms 11a and 11b having a substantially rectangular cross section and a base 11c connecting the arms 11a and 11b at the lower end. The body 11 can be made by cutting a slit 10 in, for example, a $-10°$ XY-cut quartz plate, the slit 10 extending from one end of the plate and in the lengthwise direction thereof.

On the four sides of the vibration arm 11a there are provided four excitation electrodes 12a, 12b, 12c and 12d, each being laid on two adjacent sides. More specifically, the electrode 12a is laid on the side 11a1 being parallel to arrow A showing the direction in which the quartz oscillator body 11 oscillates in a bending mode and on the side 11a2 intersecting at right angle with arrow A. Both portions of the electrode 12a which are laid respectively on the sides 11a1 and 11a2 have the same width L1. Similarly, the electrode 12b is laid on the sides 11a2 and 11a3 of the arm 11a, the side 11a3 being parallel to arrow A, and its portions laid respectively on the sides 11a2 and 11a3 have the same width L1. The electrode 12c is laid on the sides 11a3 and 11a4 of the arm 11a, the side 11a4 intersecting at a right angle with arrow A, and its portions laid respectively on the sides 11a3 and 11a4 have the same width L1. Likewise, the electrode 12d is laid on the sides 11a4 and 11a1, and its portions laid respectively on the sides 11a4 and 11a1 have the same width.

Exactly in the same manner four excitation electrodes 13a, 13b, 13c and 13d are provided on the four sides 11b1, 11b2, 11b3 and 11b4 of the other vibration arm 11b, each excitation electrode being laid on two adjacent sides.

The excitation electrodes 12a to 12d and 13a to 13d thus laid on the sides of the vibration arms 11a and 11b are connected in the following way. The upper end portion of the electrode 12a is connected to the upper end portion of the electrode 12c by a narrow connection electrode 14a which is laid on the sides 11a2 and 11a3 of the arm 11a. Similarly, the upper end portions of the electrodes 13a and 13c are connected by a narrow connection electrode 14b which is laid on the sides 11b1 and 11b4 of the arm 11b. The lower portions of the electrodes 12b and 12d are connected by a connection electrode 15a which is laid on the sides 11a3 and 11a4 of the arm 11a. Likewise, the lower portions of the electrodes 13b and 13d are connected by a connection electrode 15b which is laid on the sides 11b1 and 11b2 of the arm 11b. The excitation electrode 13c and the connection electrode 15a are formed integral with a base electrode 16a which is laid on the three sides of the base 11c. The excitation electrode 12a and the connection electrode 15b are formed integral with another base electrode 16b which is laid on the three sides of the base 11c. To the base electrode 16a a lead wire 21a is soldered to function as one input terminal which is coupled to an oscillator circuit (not shown). Likewise, to the base electrode 16b a lead wire 21b is soldered to function as another input terminal which is coupled to the oscillation circuit (not shown).

Figure 2:
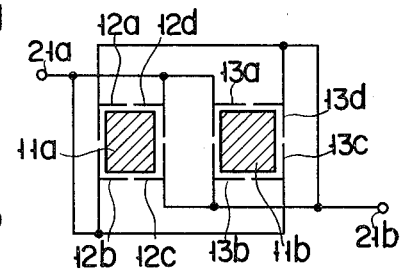
FIG. 2 shows how the electrodes of the oscillator shown in FIG. 1 are connected.

The electrodes which are laid on the sides of the quartz oscillator body 11 in the above-mentioned pattern are thus connected as illustrated in FIG. 2. As well understood from FIG. 2, the quartz oscillator body 11 is excited by excitation voltage which is supplied through two input terminals 21a and 21b. The tuning fork-shaped quartz oscillator can therefore be combind with a C-MOS integrated circuit to provide, for example, a wristwatch which is very accurate.

The electrodes can easily be laid on the sides of the body 11 in the above-mentioned pattern. For example, a gold or silver film is vapor-deposited on all the sides of the body 11 and then is photo-etched as practiced in IC manufacture, thus removing unnecessary portions.

Figure 3:
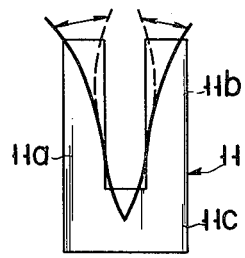
FIGS. 3 and 4 are respectively a side view of a quartz oscillator body and a perspective view of a quartz oscillator body, both illustrating how the oscillator bodies vibrate in a bending mode and a twisting mode.

Now it will be described how the tuning fork-shaped quartz oscillator shown in FIGS. 1 and 2 oscillates. When the input terminals 21a and 21b are connected to the oscillation circuit (not shown), the vibration arms 11a and 11b start vibrating in a bending mode. That is, the arms 11a and 11b are repeatedly bent in the opposite directions as illustrated in FIG. 3. As long as the input terminals 21a and 21b are connected to the oscillation circuit (not shown), the arms 11a and 11b keep on vibrating at a resonance frequency of 32.768 KHz. The arms 11a and 11b are repeatedly bent in this way by the voltage applied on those portions of the excitation electrodes 12a to 12d which are laid on the sides 11a2 and 11a4 of the arm 11a and by the voltage applied on those portions of the excitation electrodes 13a to 13d which are laid on the sides 11b2 and 11b4 of the arm 11b.

Figure 4:
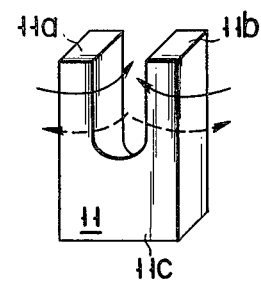

On the other hand, the voltage applied on those portions of the excitation electrodes 12a to 12d which are laid on the sides 11a1 and 11a 3 both parallel to arrow A shown in FIG. 1 twists the arm 11a in one direction and then the other as shown in FIG. 4. Similarly, the voltage applied on those portions of the excitation electrodes 13a to 13d which are laid on the sides 11b1 and 11b3 both parallel to arrow A twists the arm 11b in the same manner as shown also in FIG. 4. The arms 11a and 11b are twisted also at 32.768 KHz.

Thus, the tuning fork-shaped quartz oscillator of FIG. 1 continues to oscillate in both a bending mode and a twisting mode at the same time.

Figure 5:
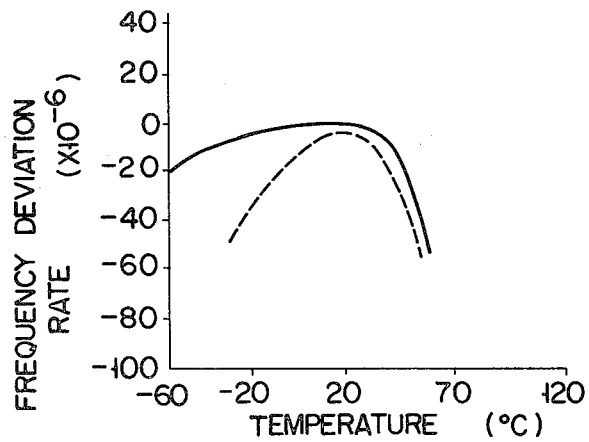
FIG. 5 is a graph showing the frequency-temperature characteristics of the oscillator shown in FIG. 1 and a prior art tuning fork-shaped quartz oscillator.

Now referring to FIG. 5. it will be described how the output frequency of an oscillation circuit provided with the quartz oscillator of FIG. 1 deviates with the variation of the ambient temperature. In FIG. 5, temperature (°C.) is plotted on the X axis, the frequency deviation rate (PPM or $10^{-6}$) is plotted on the Y axis. The broken curve represents the temperature characteristic of a prior art tuning fork-shaped quartz oscillator of bending mode. As the broken curve reveals, the output frequency of the known tuning fork-shaped quartz oscillator little deviates when the ambient temperature is 20° C., more or less. But the temperature range over which the frequency little deviates is extremely narrow. The output frequency of the prior art quartz oscillator deviates much over the temperature range within which wristwatches are usually used.

The solid curve in FIG. 5 represents the temperature characteristic of the tuning fork-shaped quartz oscillator shown in FIG. 1, i.e. the relationship between the resonance frequency and the ambient temperature. As the solid line shows, the resonance frequency of the quartz oscillator little deviates over a broad temperature range.

Figure 6:
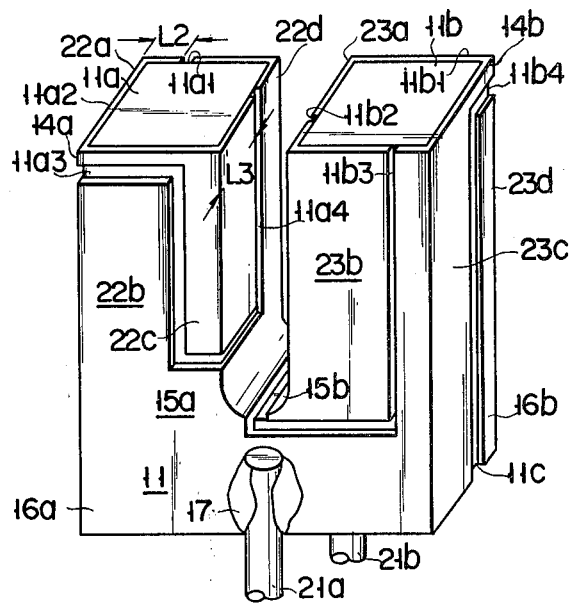
FIG. 6 is a perspective view of another tuning fork-shaped quartz oscillator embodying this invention.

FIG. 6 shows another tuning fork-shaped quartz oscillator embodying this invention. This quartz oscillator differs from the quartz oscillator shown in FIG. 1 only with respect to electrode pattern. Like or the same elements are designated by like or the same numerals as are used in FIG. 1. As shown in FIG. 6, on the four sides of a vibration arm 11a there are provided four excitation electrodes 22a, 22b, 22c and 22d, each being laid on two adjacent sides. More specifically, the electrode 22a is laid on the side 11a1 being parallel to arrow A showing the direction in which a quartz oscillator body 11 oscillates in a bending mode and on the side 11a2 intersecting at a right angle with arrow A. That portion of the electrode 22a which is laid on the side 11a1 has a width L2, whereas the portion which is laid on the side 11a2 has a width L3 twice greater than width L2. The electrode 22b is laid on the sides 11a2 and 11a3 of the arm 11a, said side 11a3 being parallel to arrow A, and its portions laid on the sides 11a2 and 11a3 have widths L2 and L3, respectively. Similarly, the electrode 22c is laid on the sides 11a3 and 11a4 of the arm 11a, said side 11a4 intersecting at a right angle with arrow A, and its portions laid on the sides 11a3 and 11a4 have widths L2 and L3, respectively. Likewise, the electrode 22d is laid on the sides 11a4 and 11a1, and its portions laid on the sides 11a4 and 11a1 have widths L2 and L3, respectively.

Exactly in the same manner four excitation electrodes 23a, 23b, 23c and 23d are provided on the four sides 11*b*1, 11*b*2, 11*b*3 and 11*b*4 of another vibration arm 11*b*, each excitation electrode being laid on two adjacent sides.

The excitation electrodes 22*a* to 22*d* and 23*a* to 23*d* thus laid on the quartz oscillator body 11 are connected by connection electrodes 14*a*, 14*b*, 15*a* and 15*b* and base electrodes 16*a* and 16*b*, exactly in the same manner as illustrated in FIG. 1. Two lead wires or input terminals 21*a* and 21*b* are soldered at one end to the base electrodes 16*a* and 16*b*, respectively. The lead wires 16*a* and 16*b* are connected at the other end to an oscillation circuit (not shown), just as in the case of the embodiment shown in FIG. 1.

Figure 7:
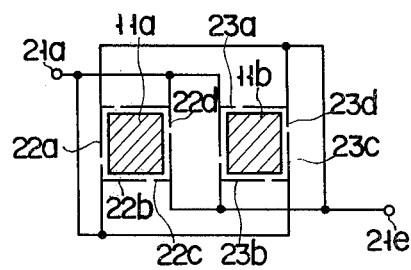
FIG. 7 shows how the electrodes of the oscillator shown in FIG. 6 are connected.

The electrodes which are laid on the sides of the quartz oscillator body 11 in the above-mentioned pattern are so connected as illustrated in FIG. 7.

Figure 8:
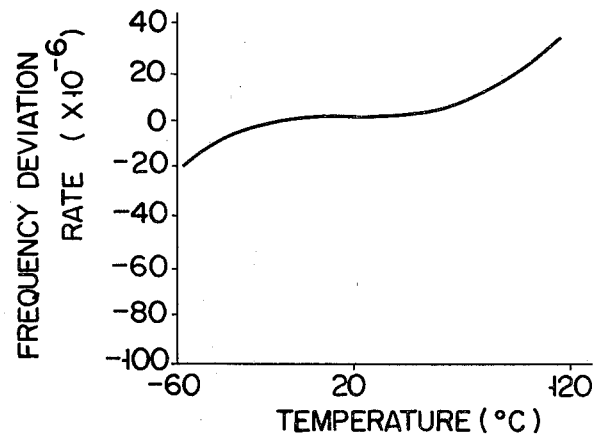
FIG. 8 is a graph illustrating the frequency-temperature characteristic of the oscillator shown in FIG. 6.

Like the quartz oscillator shown in FIG. 1, the tuning fork-shaped quartz oscillator of FIG. 6 oscillates in such bending and twisting modes as shown in FIGs. 3 and 4 at the same time. FIG. 8 shows how the resonance frequency of the quartz oscillator of FIG. 6 deviates with the variation of the ambient temperature. The temperature characteristic of the quartz oscillator of FIG. 6 is better than that of the quartz oscillator of FIG. 1 as will be evident if the solid curve in FIG. 8 is compared with the solid curve in FIG. 5. That is, its resonance frequency deviates only a little over a broader temperature range, in particular over a temperature range over 20° C.

It is thus well understood from the embodiments of FIG. 1 and FIG. 6 that the temperature characteristic of the quartz oscillator may be properly adjusted merely by changing the ratio in width between two portions of each excitation electrode.

In the embodiments of FIGS. 1 and 6, the portions of every excitation electrode have a width L1, L2 or L3 changing over their entire length. As will be apparent from FIG. 4, the free end portions of the vibration arms 11*a* and 11*b* are more twisted than the portions which are connected by the base 11*c*. The arms 11*a* and 11*b* may therefore be twisted to a sufficient extent even if excitation electrodes are laid on those portions of the sides which are near the free end of the arms 11*a* and 11*b* as illustrated in FIG. 9.

Figure 9:
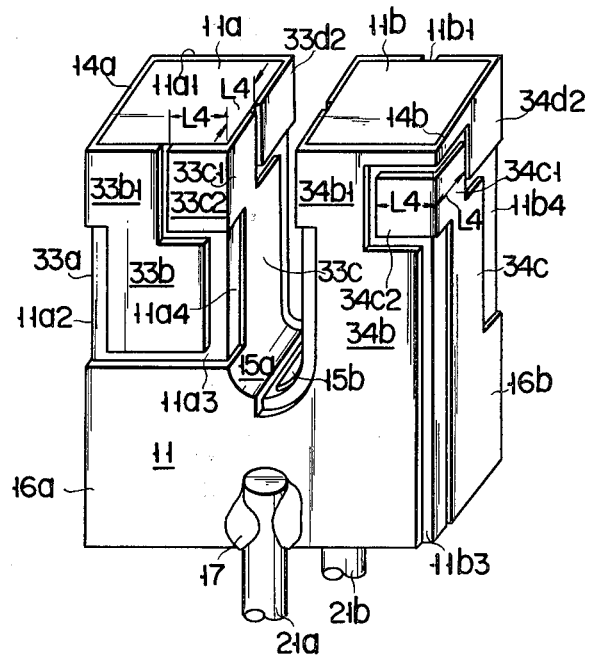
FIG. 9 is a perspective view of a further tuning fork-shaped quartz oscillator embodying this invention.

FIG. 9 shows another tuning fork-shaped quartz oscillator embodying this invention. Since this quartz oscillator differs from that of FIG. 1 only with respect to the electrode pattern, like or the same elements are designated by like or the same numerals as are used in FIG. 1. Four excitation electrodes 33*a*, 33*b*, 33*c* and 33*d* are laid respectively on the entire sides 11*a*1, 11*a*2, 11*a*3 and 11*a*4 of a vibration arm 11*a*, except for those portions near the free end of the arm 11*a*. The upper end of the excitation electrode 33*c* is connected to an electrode 33*c*1 which has a width L4 and is laid on the side 11*a*4. The electrode 33*c*1 has one side connected to an electrode 33*c*2 which has the same width L4 and is laid on the side 11*a*3. The upper ends of both electrodes 33*c*1 and 33*c*2 are flush with the top of the arm 11*a*. Similarly, the upper end of the excitation electrode 33*a* is connected to an electrode 33*a*1 which has width L4 and is laid on the side 11*a*2. The electrode 33*a*1 has one side connected to an electrode 33*a*2 which has width L4 and is laid on the side 11*a*1. Likewise, the upper end of the excitation electrode 33*b* is connected to an electrode 33*b*1 which has width L4 and is laid on the side 11*a*3. The electrode 33*b*1 has one side connected to an electrode 33*b*2 which is laid on the side 11*a*2. The upper ends of both electrodes 33*b*1 and 33*b*2 are flush with the top of the arm 11*a*. Similarly, the upper end of the electrode 33*d* is connected to an electrode 33*d*1 which has width L4 and is laid on the side 11*a*1. The electrode 33*d*1 has one side connected to an electrode 33*d*2 which is laid on the side 11*a*4. The upper ends of both electrodes 33*d*1 and 33*d*2 are flush with the top of the arm 11*a*.

Four excitation electrodes 34*a*, 34*b*, 34*c* and 34*d* are laid respectively on the entire sides 11*b*1, 11*b*2, 11*b*3 and 11*b*4 of the vibration arm 11*b*, except for the portions near the free end portions of the arm 11*b*. The excitation electrodes 34*a*, 34*b*, 34*c* and 34*d* have their upper ends connected respectively to electrodes 34*a*1, 34*b*1, 34*c*1 and 34*d* 1. These electrodes 34*a*1, 34*b*1, 34*c*1 and 34*d*1 are connected at one side respectively to electrodes 34*a*2, 34*b*2, 34*c*2 and 34*d*2 which are laid on the sides 11*b*2, 11*b*3, 11*b*1 and 11*b*4, respectively.

The excitation electrodes 33*a* to 33*d* and 34*a* to 34*d* are connected to input terminals 21*a* and 21*b* as illustrated in FIG. 7. The excitation electrodes 33*a* to 33*d* serve to vibrate the arm 11*a* chiefly in a bending mode, and the electrodes 33*a*1 to 33*d*1 and 33*a*2 and 33*d*2 serve to vibrate the arm 11*a* mainly in a twisting mode. Similarly, the excitation electrodes 34*a* to 34*d* serve to vibrate the arm 11*b* chiefly in a bending mode, and the electrodes 34*a*1 to 34*d*1 and 34*a*2 to 34*d*2 serve to vibrate the arm 11*b* mainly in a twisting mode.

As mentioned above, a tuning fork-shaped quartz oscillator according to this invention can oscillate in both a bending mode and a twisting mode at the same time. In addition, its output resonance frequency, which is relatively low, deviates little over a broad range of temperature. If combined with a C-MOS integrated circuit, it will provide an electronic device such as a wristwatch, which is small-sized and highly accurate and which consumes little power.

What is claimed is:

1. A tuning fork-shaped quartz oscillator comprising:
   a U-shaped quartz oscillator body comprising a pair of vibration arms having a substantially rectangular cross section and a base connected to said vibration arms at one end of said vibration arms;
   first and second excitation electrodes provided on the sides of each of said vibration arms, said first and second excitation electrodes each including first and second electrode portions, wherein for each vibration arm said first electrode portion of said first excitation electrode and said first electrode portion of said second excitation electrode being provided on each side of a vibration arm parallel to the direction of the bending mode vibration of the vibration arm, said second electrode portion of said first excitation electrode being contiguous to said first electrode portion thereof, said second electrode portion of said first excitation electrode being laid on one side of the vibration arm adjacent to the side on which the first electrode of said first excitation electrode portion is laid, and said second electrode portion of said second excitation electrode being contiguous to said first electrode portion of said second excitation electrode, said second electrode portion of said second excitation electrode being laid on the other side of the vibration arm adjacent to the side on which said first electrode portion of said second excitation electrode is laid; and connecting means including a first input terminal and a second input terminal coupled to said excitation electrodes for supplying drive voltage to said excitation electrodes for causing said vibration arms to keep vibrating in opposite phase relation in both a bending mode and a twisting mode.

2. The tuning fork-shaped quartz oscillator of claim 1, wherein said first electrode portions of said first and second excitation electrodes are substantially of the same width.

3. The tuning fork-shaped quartz oscillator of claim 1, wherein said first electrode portion of said first excitation electrode has a width about twice that of said first electrode portion of said second excitation electrode.

4. The tuning fork-shaped quartz oscillator of claim 1, wherein said first and second electrode portions of said first and second excitation electrodes are each laid on respective different sides of said vibration arm.

5. The tuning fork-shaped quartz oscillator of claim 2, wherein said first and second electrode portions of said first excitation electrodes are on sides of said vibration arm adjacent a given corner of the substantially rectangular cross-section vibration arm, and wherein said first and second electrode portions of said second excitation electrode are on sides of said vibration arm which are adjacent the opposite corner of said vibration arm.

6. The tuning fork-shaped quartz oscillator of claim 1, wherein said first and second electrode portions of said first excitation electrodes are on sides of said vibration arm adjacent a given corner of the substantially rectangular cross-section vibration arm, and wherein said first and second electrode portions of said second excitation electrode are on sides of said vibration arm which are adjacent the opposite corner of said vibration arm.

7. The tuning fork-shaped quartz oscillator of claim 1, wherein each of said excitation electrodes further comprises a third electrode portion between said first and second electrode portions and being contiguous therewith, said first electrode portion being laid on the entire respective side of the respective vibration arm, except for the area near the free end of said respective vibration arm; said third electrode portion being of a predetermined width and being laid on the same vibration arm side as said first electrode portion is laid on and extending from said first electrode portion toward the free end of the respective vibration arm; and said second electrode portion being laid on the side adjacent to the vibration arm side on which said third portion is laid, and extending near the free end of the respective vibration arm from one side of said third electrode portion.

8. The tuning fork-shaped quartz oscillator of claim 1, further comprising:
third and fourth excitation electrodes provided on the sides of each of said vibration arms, said third and fourth excitation electrodes each including first and second electrode portions, wherein for each vibration arm, said first electrode portion of said third excitation electrode and said first electrode portion of said fourth excitation electrode being provided on each side of a vibration arm parallel to the direction of the bending mode vibration of the vibration arm, said second electrode portion of said third excitation electrode being contiguous to said first electrode portion thereof, said second electrode portion of said third excitation electrode being laid on one side of said vibration arm adjacent to the side on which said first electrode of said third excitation electrode portion is laid, and said second electrode portion of said fourth excitation electrode being contiguous to said first electrode portion of said fourth excitation electrode, said second electrode portion of said fourth excitation electrode being laid on the other side of said vibration arm adjacent to the side on which said first electrode portion of said fourth excitation electrode is laid; and
connecting means including a terminal coupled to said third and fourth excitation electrodes for supplying drive voltage to said third and fourth excitation electrodes for causing said vibration arms to keep vibrating in opposite phase relation in both a bending and a twisting mode.

9. The tuning fork-shaped quartz oscillator of claim 8, wherein said excitation electrodes are all coupled together in parallel for supplying drive voltage thereto.

10. The tuning fork-shaped quartz oscillator of claim 8, wherein said first electrode portion of said first, second, third and fourth excitation electrodes are substantially of the same width.

11. The tuning fork-shaped quartz oscillator of claim 8, wherein said first and second electrode portions of said first, second and third excitation electrodes are each laid on respective different sides of said vibration arm.

12. The tuning fork-shaped quartz oscillator of claim 9, wherein said first and second electrode portions of said first and third excitation electrodes are on sides of said vibration arm adjacent a given corner of the substantially rectangular cross-section vibration arm, and wherein said first and second electrode portions of said second and fourth excitation electrodes are on sides of said vibration arm which are adjacent the opposite corner of said vibration arm.

13. The tuning fork-shaped quartz oscillator of claim 8, wherein:
said first and second electrode portions of said first excitation electrodes are on sides of said vibration arm adjacent a first corner of the substantially rectangular cross-section vibration arm;
said first and second electrode portions of said second excitation electrodes are on sides of said vibration arm which are adjacent the corner opposite side first corner of said vibration arm; said first and second electrode portions of said third excitation electrodes are on sides of said vibration arm adjacent a second corner of said substantially rectangular cross-section vibration arm, said second corner being adjacent said first corner; and
said first and second electrode portions of said fourth excitation electrode are on sides of said vibration arm which are adjacent the corner opposite said second corner of said vibration arm.

* * * * *